(12) United States Patent
Abe

(10) Patent No.: US 8,535,977 B2
(45) Date of Patent: Sep. 17, 2013

(54) SEMICONDUCTOR DEVICE MANUFACTURING METHOD

(75) Inventor: Keiko Abe, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 22 days.

(21) Appl. No.: 13/369,427

(22) Filed: Feb. 9, 2012

(65) Prior Publication Data

US 2012/0142145 A1 Jun. 7, 2012

Related U.S. Application Data

(63) Continuation of application No. PCT/JP2009/066831, filed on Sep. 28, 2009.

(51) Int. Cl.
*H01L 21/00* (2006.01)

(52) U.S. Cl.
USPC .... 438/107; 438/109; 438/667; 257/E21.499; 257/E21.505; 257/E21.507

(58) Field of Classification Search
None
See application file for complete search history.

(56) References Cited

U.S. PATENT DOCUMENTS

| | | | |
|---|---|---|---|
| 2008/0318361 A1* | 12/2008 | Han et al. | 438/109 |
| 2009/0001437 A1* | 1/2009 | Won et al. | 257/300 |

FOREIGN PATENT DOCUMENTS

| | | |
|---|---|---|
| JP | 2003-197855 A | 7/2003 |
| JP | 2004-039667 A | 2/2004 |
| JP | 2005-197339 A | 7/2005 |
| JP | 2006-287211 A | 10/2006 |
| JP | 2009-004593 A | 1/2009 |
| JP | 2009-004722 A | 1/2009 |
| JP | 2009-141010 A | 6/2009 |

OTHER PUBLICATIONS

International Search Report Dated Nov. 17, 2009 from PCT/JP2009/066831.

* cited by examiner

*Primary Examiner* — Charles Garber
*Assistant Examiner* — Abdulfattah Mustapha
(74) *Attorney, Agent, or Firm* — Ohlandt, Greeley, Ruggiero & Perle, L.L.P.

(57) ABSTRACT

According to one embodiment, a semiconductor device manufacturing method includes producing a first substrate with an electrode, producing a second substrate with a through hole, stacking the second substrate on the first substrate, with an insulating layer intervening between the first substrate and the second substrate, making a hole reaching the electrode in the insulating layer under the through hole by etching the insulating layer with the second substrate as a mask, and filling the through hole and the hole with conductive substance.

12 Claims, 10 Drawing Sheets

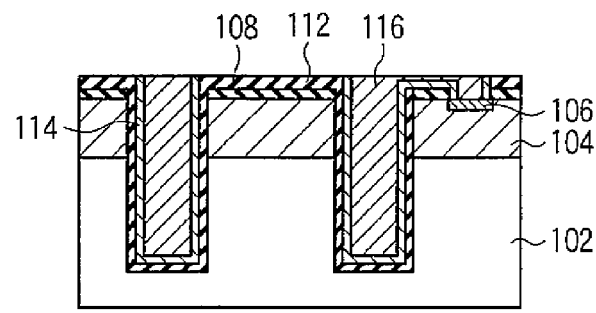
F I G. 7
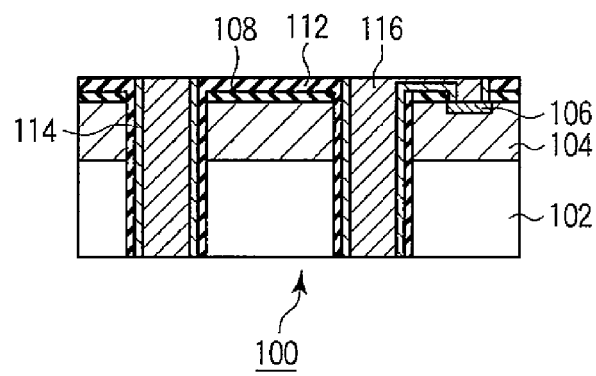
F I G. 8
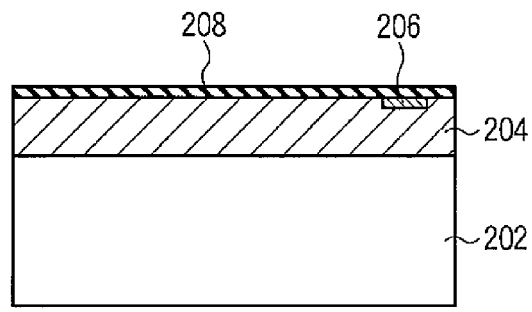
F I G. 9

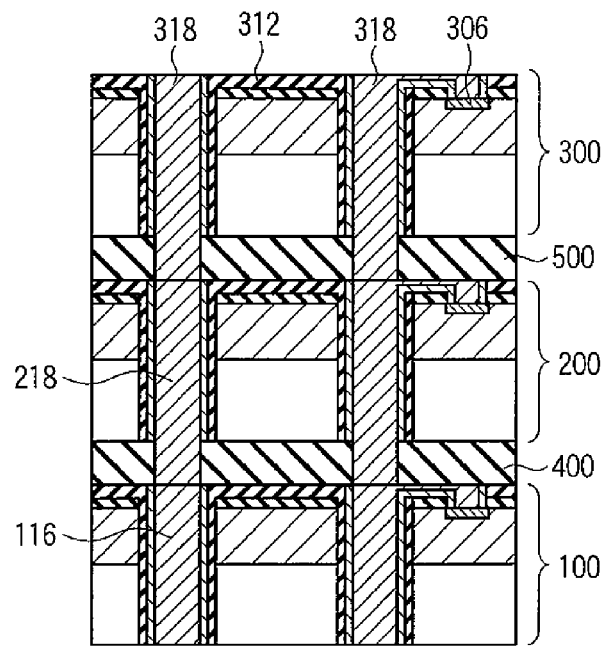
F I G. 22
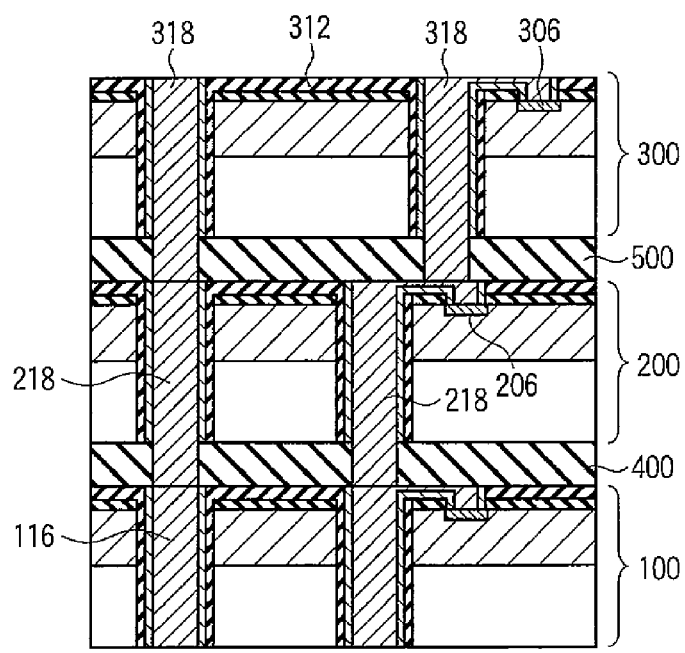
F I G. 23

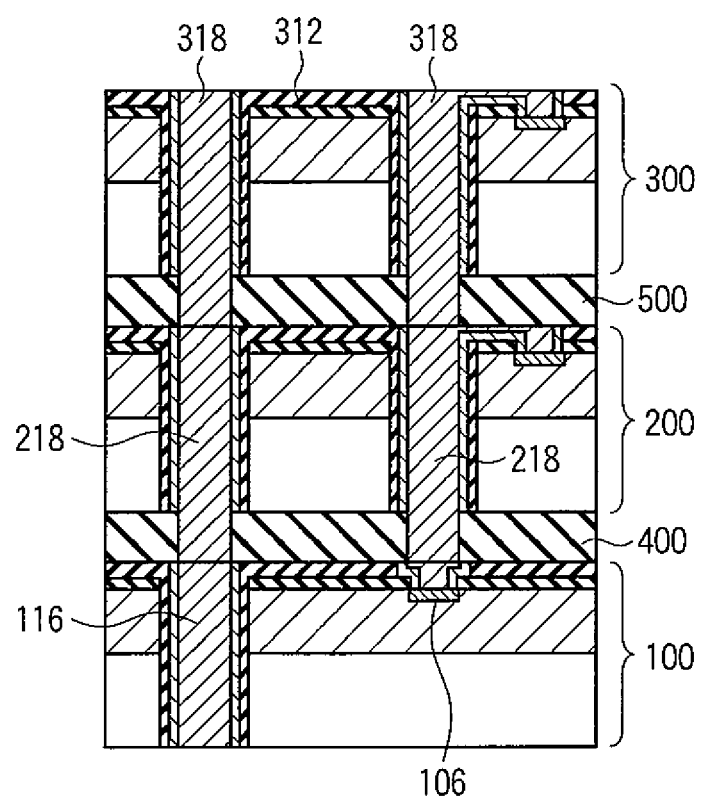
F I G. 24

SEMICONDUCTOR DEVICE MANUFACTURING METHOD

CROSS REFERENCE TO RELATED APPLICATIONS

This application is a Continuation Application of PCT Application No. PCT/JP2009/066831, filed Sep. 28, 2009, the entire contents of which are incorporated herein by reference.

FIELD

Embodiments described herein relate generally to a semiconductor device manufacturing method.

BACKGROUND

A three-dimensional integrated circuit (LSI) has been proposed with a view to integrating a semiconductor device (semiconductor integrated circuit device) on a much larger scale and speeding up the device more. In the three-dimensional LSI, substrates are electrically connected to one another using through electrodes called Through Silicon Vias (TSVs).

In the three-dimensional LSI, after an upper and a lower substrate are pressed against each other to pressure-bond bumps together, the space between substrates is filled with adhesive, thereby laminating the substrates together. However, this method might do heavy damage to elements in the LSI when pressure is applied to the upper and lower substrates. When the space between substrates is narrow, it is difficult to fill the space with adhesive.

To overcome the above problems, JP-A 2005-197339 (KOKAI) has disclosed the following method. First, a through hole is made in a substrate (wafer). An insulating film is formed on the inner surface of the through hole. After the underside of the substrate is polished, an insulating layer is formed on the underside of the substrate. Then, after the insulating layer on the underside is patterned, the substrates are laminated together. Thereafter, the through hole is filled with conductive material, thereby electrically connecting the substrates with each other. However, since the insulting layer formed on the underside of the substrate with large roughness is pattered, a problem arises: sufficient processing accuracy cannot be obtained.

As described above, it has been difficult to produce a three-dimensional LSI effectively.

BRIEF DESCRIPTION OF THE DRAWINGS

FIG. 7 is a sectional view schematically showing a part of the semiconductor device manufacturing method according to the embodiment;

FIG. 8 is a sectional view schematically showing a part of the semiconductor device manufacturing method according to the embodiment;

FIG. 9 is a sectional view schematically showing a part of the semiconductor device manufacturing method according to the embodiment;

FIG. 22 is a sectional view schematically showing a part of the semiconductor device manufacturing method according to the embodiment;

FIG. 23 is a sectional view schematically showing the configuration of a semiconductor device according to a first modification of the embodiment; and FIG. 24 is a sectional view schematically showing the configuration of a semiconductor device according to a second modification of the embodiment.

DETAILED DESCRIPTION

In general, according to one embodiment, a semiconductor device manufacturing method includes producing a first substrate with an electrode; producing a second substrate with a through hole; stacking the second substrate on the first substrate, with an insulating layer intervening between the first substrate and the second substrate; making a hole reaching the electrode in the insulating layer under the through hole by etching the insulating layer with the second substrate as a mask; and filling the through hole and the hole with conductive substance.

Hereinafter, referring to the accompanying drawings, an embodiment will be explained.

FIGS. 1 to 22 are sectional views schematically showing a semiconductor device manufacturing method according to an embodiment. The embodiment will be explained taking a three-layer-structure three-dimensional LSI as an example.

FIGS. 1 to 8 show processes of manufacturing a first-layer substrate.

Figure 1:
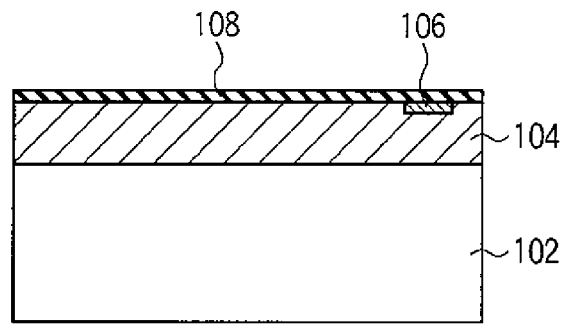
FIG. 1 is a sectional view schematically showing a part of a semiconductor device manufacturing method according to an embodiment.

First, as shown in FIG. 1, a substrate on which an integrated circuit has been formed is prepared. In FIG. 1, numeral 102 indicates a silicon substrate (silicon wafer) as a semiconductor substrate, 104 a circuit region formed at the surface of the silicon substrate 102, 106 a top metal layer serving as a connection terminal of a circuit, and 108 a passivation film.

Figure 2:
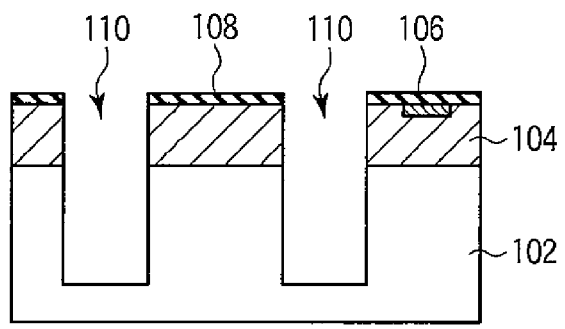
FIG. 2 is a sectional view schematically showing a part of the semiconductor device manufacturing method according to the embodiment.

Next, as shown in FIG. 2, holes 110 are made in the substrate by etching. In this case, anisotropic etching, such as reactive ion etching (RIE), is used. As an etching gas, a mixed gas of $SF_6$ and $O_2$ or a mixed gas of $SF_6$, $O_2$, and $C_4F_8$ can be used.

Figure 3:
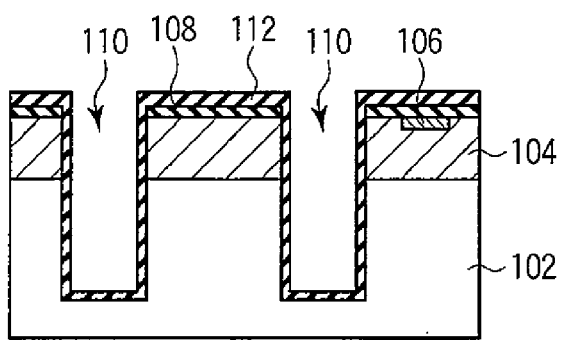
FIG. 3 is a sectional view schematically showing a part of the semiconductor device manufacturing method according to the embodiment.

Next, as shown in FIG. 3, an insulating film 112 is deposited on the inner surfaces of the holes 110. As a material for the insulating film 112, silicon oxide, silicon nitride, organic silica, or the like can be used. As for the method of depositing the insulating film 112, a plasma chemical vapor deposition (CVD) method, a thermal CVD method, or the like can be used.

Figure 4:
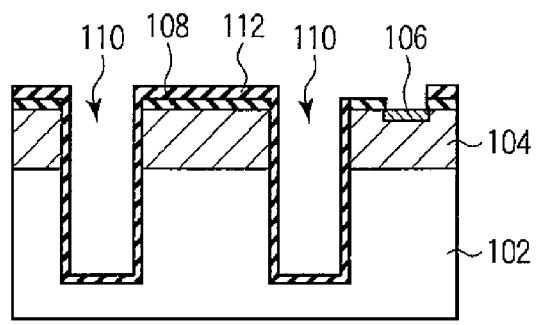
FIG. 4 is a sectional view schematically showing a part of the semiconductor device manufacturing method according to the embodiment.

Next, as shown in FIG. 4, the insulating film 112 is patterned so as not only to make holes in the top surface of the top metal layer 106 but also to make trenches for interconnections that connect the top metal layer 106 to a through electrode 116 described later.

Figure 5:
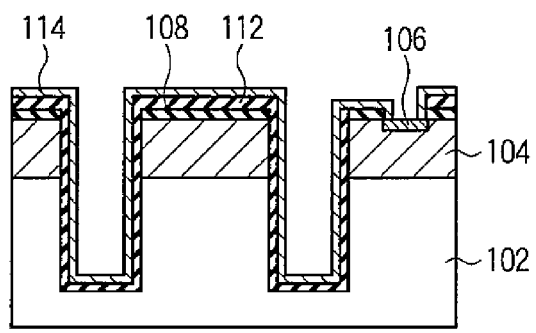
FIG. 5 is a sectional view schematically showing a part of the semiconductor device manufacturing method according to the embodiment.

Next, as shown in FIG. 5, a conductive barrier film 114 is formed. Providing the barrier film 114 enables a conductive material filling the holes 110 and the like to be prevented from diffusing into the silicon substrate. As the barrier film 114, barrier metal, such as Ta, TaN, or TiN, or polysilicon can be used. In addition, as the method of depositing the barrier film 114, a thermal CVD method, an atomic layer deposition (ALD) method, a plasma CVD method, a reactive sputtering method, an ionization sputtering method, or the like can be used. When polysilicon is used as a conductive material with which the holes 110 and others are filled, the process of forming the barrier film 114 may be omitted.

Figure 6:
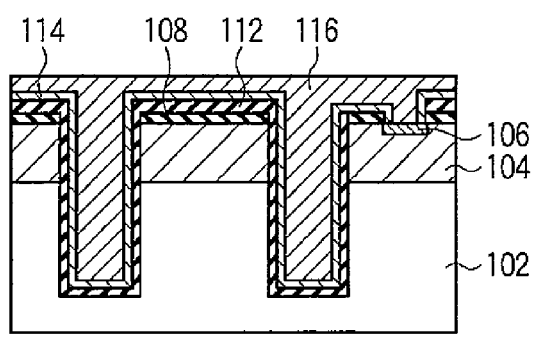
FIG. 6 is a sectional view schematically showing a part of the semiconductor device manufacturing method according to the embodiment.

Next, as shown in FIG. 6, a conductive material 116 is deposited on the entire surface so that the holes 110 and the holes and trenches made in the process of FIG. 4 may be filled with the conductive material 116. As the conductive material 116, Cu, W, Al, polysilicon, or the like may be used. In addition, as the method of depositing the conductive material 116, a physical vapor deposition (PVD) method, a CVD method, a plating method, an LPCVD method, or the like may be used.

Next, as shown in FIG. 7, the conductive material 116 is polished by chemical mechanical polishing (CMP). This removes the conductive material 116 formed on the parts excluding the holes and trenches. As a result, electrodes are formed in the holes 110.

Next, as shown in FIG. 8, mechanical polishing and etching are performed from the underside surface side of the substrate, thereby exposing the electrodes 116. As a result, TSV (Through Silicon Via)-structure through electrodes 116 are obtained.

FIGS. 9 to 14 show the processes of manufacturing a second-layer substrate.

First, as shown in FIG. 9, a substrate on which an integrated circuit has been formed is prepared. In FIG. 9, numeral 202 indicates a silicon substrate (silicon wafer) as a semiconductor substrate, 204 a circuit region formed at the surface of the silicon substrate 202, 206 a top metal layer serving as a connection terminal of a circuit, and 208 a passivation film.

Figure 10:
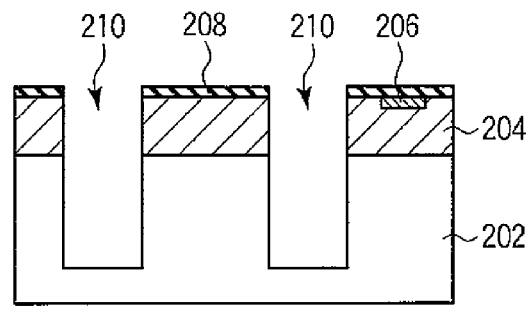
FIG. 10 is a sectional view schematically showing a part of the semiconductor device manufacturing method according to the embodiment.

Next, as shown in FIG. 10, holes 210 are made in the substrate by etching. In this case, the same method as shown in the process of FIG. 2 can be used.

Figure 11:
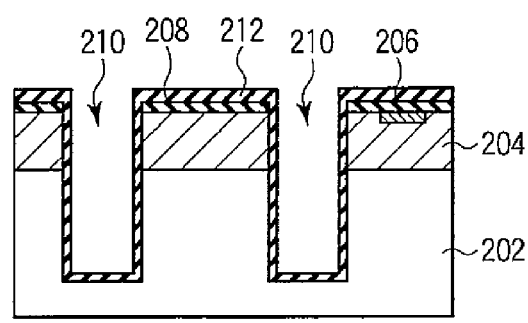
FIG. 11 is a sectional view schematically showing a part of the semiconductor device manufacturing method according to the embodiment.

Next, as shown in FIG. 11, an insulating film 212 is deposited on the inner surfaces of the holes 210. The same material and same deposition method as shown in the process of FIG. 3 can be used as the insulating film 212 and the deposition method.

Figure 12:
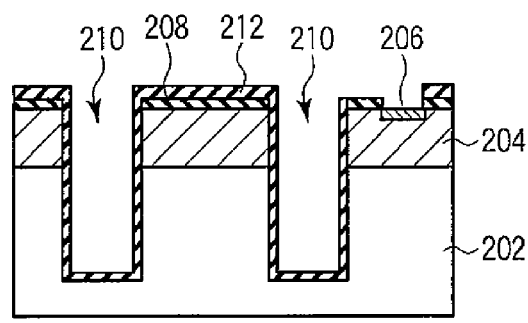
FIG. 12 is a sectional view schematically showing a part of the semiconductor device manufacturing method according to the embodiment.

Next, as shown in FIG. 12, the insulating film 212 is patterned so as not only to make holes in the top surface of the top metal layer 206 but also to make trenches for interconnections that connect the top metal layer 206 to a through electrode 218 described later.

Figure 13:
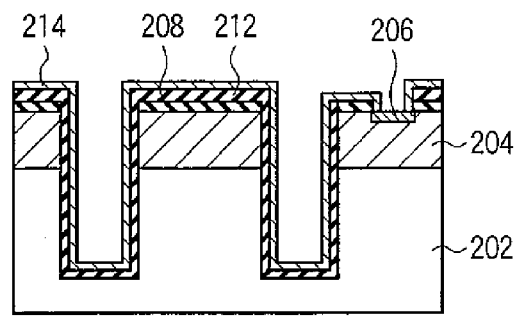
FIG. 13 is a sectional view schematically showing a part of the semiconductor device manufacturing method according to the embodiment.

Next, as shown in FIG. 13, a conductive barrier film 214 is formed. The same material and same deposition method as shown in the process of FIG. 5 can be used as the material for the barrier film 214 and the deposition method. When polysilicon is used as a conductive material with which the holes 210 and others are filled, the process of forming the barrier film 214 may be omitted.

Figure 14:
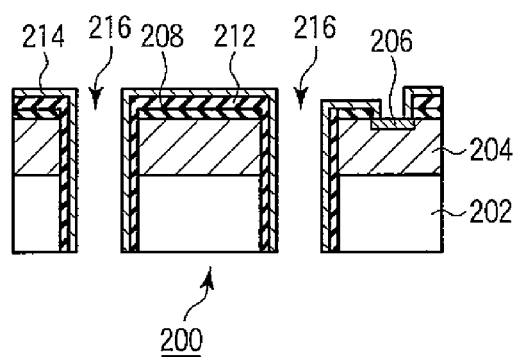
FIG. 14 is a sectional view schematically showing a part of the semiconductor device manufacturing method according to the embodiment.

Next, as shown in FIG. 14, mechanical polishing and etching are performed from the underside surface side of the substrate, thereby making through holes 216. To prevent polishing and etching from doing damage to the beginning of the through holes, the holes 210 serving as the through holes 216 may be filled with a dummy material, such as polysilicon, before polishing and etching are done. In this case, the dummy material is removed after the dummy material is exposed from underside surface side of the substrate by polishing and etching. Polysilicon used as a dummy material can be made by an LPCVD method using silane gas.

A third-layer substrate can be manufactured in the same processes as the second-layer substrate and therefore an explanation will be omitted.

FIGS. 15 to 22 show processes of stacking the first-layer substrate to the third-layer substrate one on top of another.

First, as shown in FIGS. 15 to 18, a second-layer substrate (a second substrate) 200 is stacked on a first-layer substrate (a first substrate) 100. Specifically, the processes proceed as follows.

Figure 15:
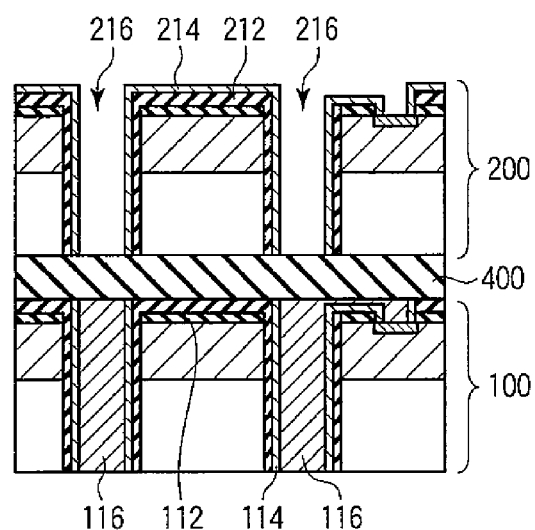
FIG. 15 is a sectional view schematically showing a part of the semiconductor device manufacturing method according to the embodiment.

First, as shown in FIG. 15, an insulating layer 400 is formed on the first-layer substrate (first substrate) 100. On the insulating layer 400, the second-layer substrate (second substrate) 200 is stacked. At this time, the first substrate 100 and second substrate 200 are aligned with each other so that the center of the through electrode 116 of the first substrate 100 may coincide with the center of the through hole 216 of the second substrate 200. Such a resin as polyimide or benzocyclobutene (BCB) can be used as the insulating layer 400. In addition, a silicon oxide film or a silicon nitride film may be used as the insulating layer 400.

Figure 16:
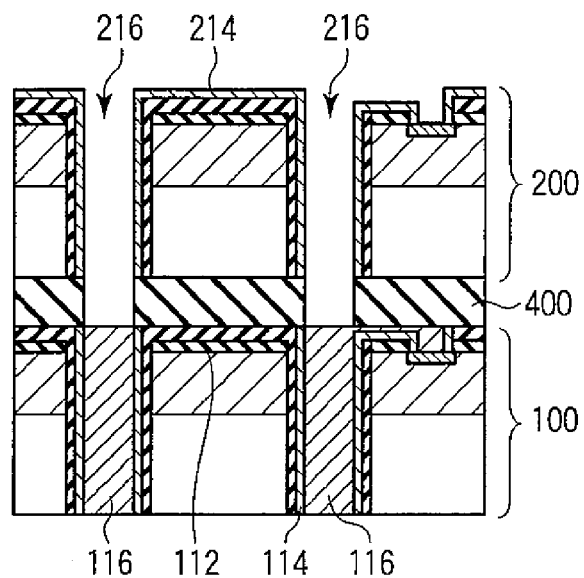
FIG. 16 is a sectional view schematically showing a part of the semiconductor device manufacturing method according to the embodiment.

Next, as shown in FIG. 16, with the second substrate 200 as a mask, the insulating layer 400 is etched, making a hole that reaches the through electrode 116 in the insulating layer 400 immediately under the through hole 216. That is, etchant is supplied through the through hole 216 to the insulating layer 400, making an opening of the same planar shape as the through hole 216 in the insulating layer 400. To prevent the insulating film 212 and barrier film 214 formed on the inner surface (inner wall) of the through hole 216 from being lost at the time of etching, the insulating layer 400 is selectively etched with respect to the insulating film 212 and barrier film 214. That is, the etching rate of the insulating layer 400 is made higher than that of the insulating film 212 and that of the barrier film 214 with respect to the etchant used in etching the insulating layer 400. When the barrier film 214 has been formed on the top layer of the inner surface of the through hole 216, such a resin as polyimide or benzocyclobutene (BCB) can be used as the insulating layer 400. In addition, a silicon oxide film or a silicon nitride film may be used as the insulating layer 400. When the insulating film 212 has been formed on the top layer of the inner surface of the through hole 216 without forming the barrier film 214, a silicon oxide film may be used as the insulating film 212 and such a resin as polyimide or benzocyclobutene (BCB) may be used as the insulating layer 400. At this time, RIE is performed using a mixed gas of $CF_4$ and $O_2$ as an etching gas, enabling polyimide or BCB to be selectively etched.

If in the process of FIG. 14, the through hole 216 has been filled with a dummy material, the dummy material is removed before the process of FIG. 16. Specifically, the dummy material is removed before or after the first substrate 100 and second substrate 200 are stacked one on top of another in the process of FIG. 15. If the dummy material is removed after the second substrate 200 is stacked, damage to the beginning of the through hole in stacking the second substrate 200 can be prevented. When polysilicon has been used as a dummy material, the dummy material can be removed by RIE using a mixed gas of $CF_4$ and $O_2$ as an etching gas or by plasma etching.

Figure 17:
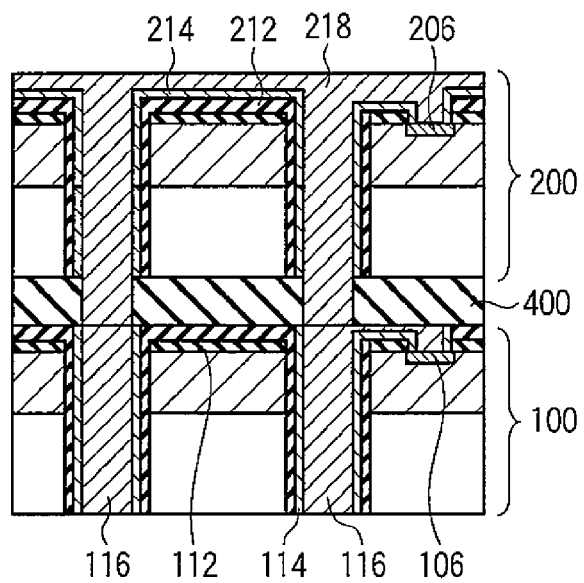
FIG. 17 is a sectional view schematically showing a part of the semiconductor device manufacturing method according to the embodiment.

Next, as shown in FIG. 17, a conductive material (conductive substance) 218 is deposited on the entire surface. The through holes 216, openings made in the insulating layer 400 immediately under the through holes 216, and holes and trenches for interconnections made in the top surface of the top metal layer 206 in the process of FIG. 13 are filled with the conductive material 218. The same material and same deposition method as shown in the process of FIG. 6 can be used as the conductive material 218 and the deposition method.

Figure 18:
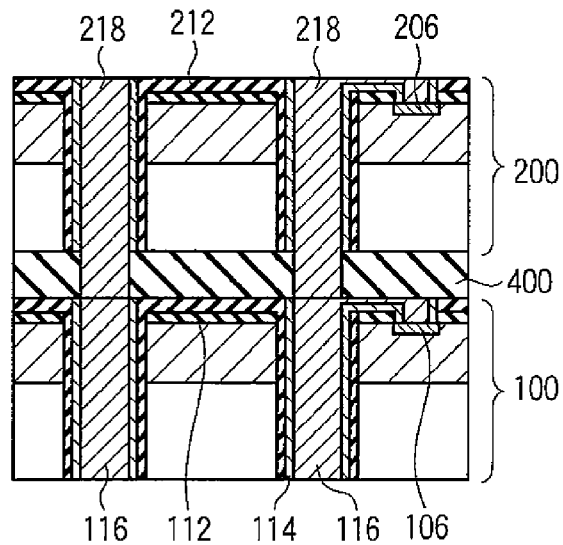
FIG. 18 is a sectional view schematically showing a part of the semiconductor device manufacturing method according to the embodiment.

Next, as shown in FIG. 18, the conductive material 218 is polished by CMP, thereby removing the conductive material 218 formed in the parts excluding the holes and trenches. As a result, through electrodes 218 are formed in the through holes 216 and in the openings immediately under the through holes 216. That is, the through electrode 116 and the through electrode 218 are connected to each other via the opening made in the insulating layer 400.

Next, as shown in FIGS. 19 to 22, a third-layer substrate (third substrate) 300 is stacked on the second-layer substrate (second substrate) 200. Since the basic stacking process of the third substrate is the same as that of the second substrate, what has already been explained will be omitted.

Figure 19:
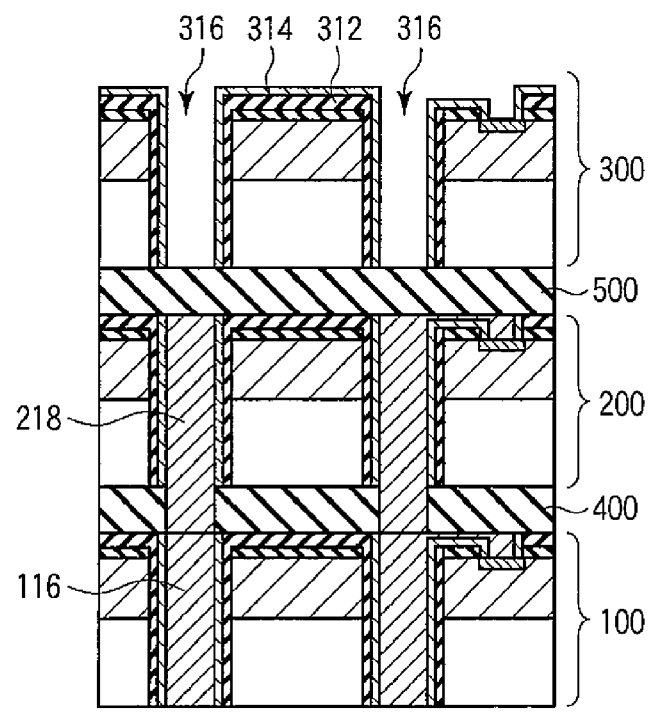
FIG. 19 is a sectional view schematically showing a part of the semiconductor device manufacturing method according to the embodiment.

First, as shown in FIG. 19, an insulating layer 500 is formed on the second-layer substrate (second substrate) 200. On the insulating layer 500, the third-layer substrate (third substrate) 300 is stacked. At this time, the second substrate 200 and third substrate 300 are aligned with each other so that the center of the through electrode 218 of the second substrate 200 may coincide with the center of the through hole 316 of the third substrate 300.

Figure 20:
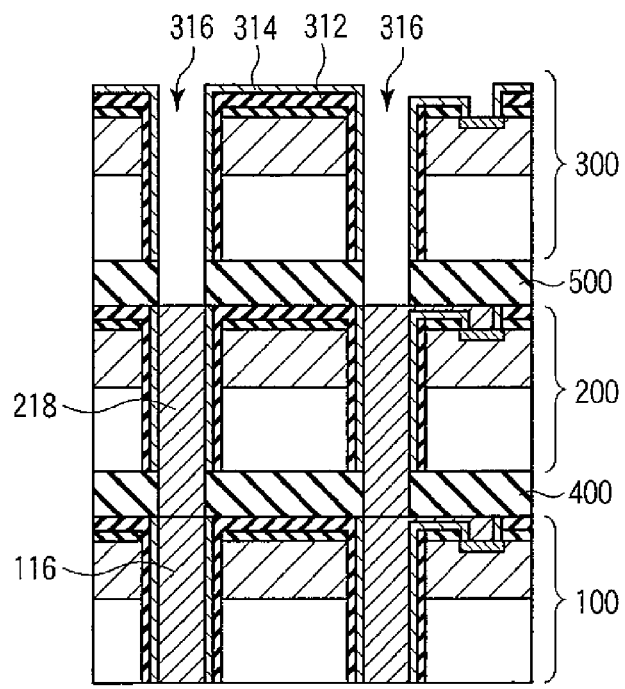
FIG. 20 is a sectional view schematically showing a part of the semiconductor device manufacturing method according to the embodiment.

Next, as shown in FIG. 20, with the third substrate 300 as a mask, the insulating layer 500 is etched, thereby making an opening that reaches the through electrode 218 in the insulating layer 500 immediately under the through hole 316. That is, etchant is supplied through the through hole 316 to the insulating layer 500, making an opening of the same planar shape as the through hole 316 in the insulating layer 500.

Figure 21:
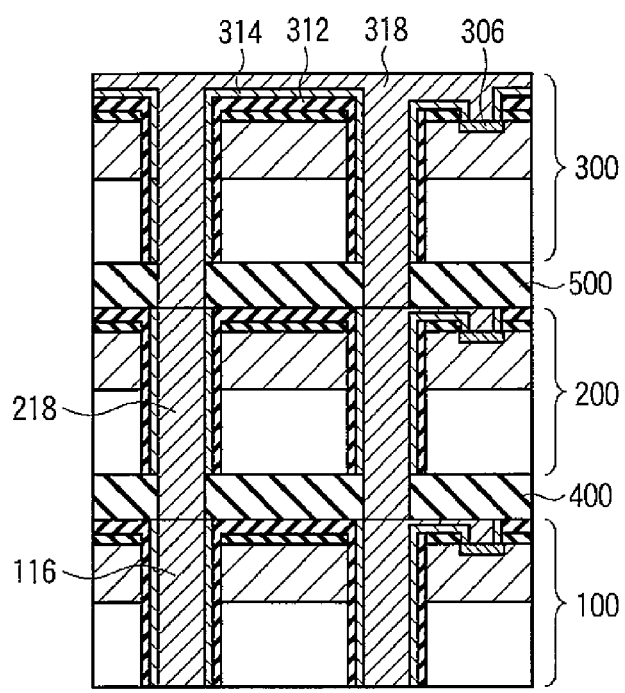
FIG. 21 is a sectional view schematically showing a part of the semiconductor device manufacturing method according to the embodiment.

Next, as shown in FIG. 21, a conductive material (conductive substance) 318 is deposited on the entire surface. The through holes 316, openings made in the insulating layer 500 immediately under the through holes 316, and holes and trenches for interconnections made in the top surface of the top metal layer 306 are filled with the conductive material 318.

Next, as shown in FIG. 22, the conductive material 318 is polished by CMP, thereby removing the conductive material 318 formed in the parts excluding the holes and trenches. As a result, through electrodes 318 are formed in the through holes 316 and in the openings immediately under the through holes 316. That is, the through electrodes 218 and through electrodes 318 are connected to one another via the openings made in the insulating layer 500.

As described above, a structure where through electrodes 116, 218, and 318 are connected to one another through the openings made in the insulating layer 400 and through the openings made in the insulating layer 500 is obtained.

As described above, in the embodiment, the insulating layer 400 intervening between the first substrate 100 and second substrate 200 is etched with the second substrate 200 as a mask, thereby forming openings in the insulating layer 400 under the through holes 216. The through holes and openings are filled with conductive substance, forming through electrodes. In this way, etching is performed with the second substrate 200 as a mask, which enables not only the manufacturing processes to be simplified but also the electrodes of the stacked substrates to be connected to each other reliably. The same holds true for the relationship between the second substrate and third substrate. Therefore, semiconductor devices excellent in characteristic and reliability can be manufactured with simple processes.

In addition, since the substrate is patterned from the front surface side, not from the underside surface side, microfabrication can be performed with high accuracy, enabling a high-density pattern to be formed. Moreover, since the substrates are not bonded together using bumps, this eliminates damage to the substrates due to pressurization at the time of bump bonding, enabling a highly-reliable semiconductor device to be obtained.

FIG. 23 is a sectional view schematically showing the configuration of a semiconductor device according to a first modification of the embodiment. While in the embodiment, the centers of the through electrodes are caused to coincide with one another, the centers of the through electrodes may not coincide with one another. In the example of FIG. 23, the connection part of the through electrode 218 of the second substrate 200 and the top metal layer 206 virtually functions as an electrode, electrically connecting the through electrode 218 of the second substrate 200 and the through electrode 318 of the third substrate 300 with each other. Even with this configuration, the same effect as described above can be obtained.

FIG. 24 is a sectional view schematically showing the configuration of a semiconductor device according to a second modification of the embodiment. In this modification, the first substrate 100 has a part where no through electrode is formed and the through electrode 218 of the second substrate 200 is connected to the top metal layer 106 of the first substrate. Even with this configuration, the same effect as described above can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising:
    producing a first substrate with an electrode;
    producing a second substrate with a through hole;
    stacking the second substrate on the first substrate, with an insulating layer intervening between the first substrate and the second substrate;
    making a hole reaching the electrode in the insulating layer under the through hole by etching the insulating layer using the stacked second substrate as a mask; and
    filling the through hole and the hole with conductive substance.

2. The method of claim 1, wherein an insulating film is formed on an inner surface of the through hole.

3. The method of claim 2, wherein the insulating layer has a higher etching rate than that of the insulating film with respect to etchant used in etching the insulating layer.

4. The method of claim 2, wherein a material of the insulating film is selected from silicon oxide, silicon nitride, and organic silica.

5. The method of claim 2, wherein a conductive barrier film is formed on the insulating film.

6. The method of claim 5, wherein the insulating layer has a higher etching rate than that of the conductive barrier film with respect to etchant used in etching the insulating layer.

7. The method of claim 5, wherein a material of the conductive barrier film is selected from Ta, TaN, TiN, and polysilicon.

8. The method of claim 1, wherein a material of the insulating layer is selected from benzocyclobutene, polyimide, silicon oxide, and silicon nitride.

9. The method of claim 1, wherein producing the second substrate with the through hole includes
    forming a preliminary hole in the second substrate,
    filling the preliminary hole for forming the through hole with a dummy material,
    exposing the dummy material filled in the preliminary hole from an underside surface side of the second substrate, and
    removing the dummy material.

10. The method of claim 1, wherein producing the second substrate with the through hole includes
    forming a preliminary hole in the second substrate,
    filling the preliminary hole for forming the through hole with a dummy material, and
    exposing the dummy material filled in the preliminary hole from an underside surface side of the second substrate,
    wherein the dummy material is removed after the second substrate is stacked.

11. The method of claim 10, wherein the dummy material includes polysilicon.

12. The method of claim 1, wherein the conductive substance is selected from Cu, W, Al, and polysilicon.

* * * * *